United States Patent
Lark, Jr. et al.

(10) Patent No.: US 11,017,963 B2
(45) Date of Patent: May 25, 2021

(54) INTELLIGENT LIGHTING CONTROL SYSTEM INCLUDING RELEASABLE FACEPLATE

(71) Applicant: Racepoint Energy, LLC, Osterville, MA (US)

(72) Inventors: William Lark, Jr., Glendale, CA (US); Nicholas David Pennycooke, San Mateo, CA (US)

(73) Assignee: Racepoint Energy, LLC, Osterville, MA (US)

( * ) Notice: Subject to any disclaimer, the term of this patent is extended or adjusted under 35 U.S.C. 154(b) by 247 days.

(21) Appl. No.: 15/643,515

(22) Filed: Jul. 7, 2017

(65) Prior Publication Data

US 2018/0012710 A1    Jan. 11, 2018

Related U.S. Application Data

(60) Provisional application No. 62/360,253, filed on Jul. 8, 2016, provisional application No. 62/359,697, filed on Jul. 7, 2016.

(51) Int. Cl.
*H01H 9/54* (2006.01)
*H05B 47/11* (2020.01)
(Continued)

(52) U.S. Cl.
CPC .............. *H01H 9/54* (2013.01); *G01R 19/165* (2013.01); *H01H 21/22* (2013.01); *H02G 3/123* (2013.01);
(Continued)

(58) Field of Classification Search
CPC ........ G01R 19/165; H01H 21/22; H01H 9/54; H02G 3/123; H02G 3/14; H03K 17/962; H05B 37/0218; H05B 37/0236
See application file for complete search history.

(56) References Cited

U.S. PATENT DOCUMENTS

| | | | |
|---|---|---|---|
| 5,239,205 A | * | 8/1993 | Hoffman ................ H01H 23/00 200/277.2 |
| 7,576,285 B1 | | 8/2009 | Savicki, Jr. |

(Continued)

OTHER PUBLICATIONS

International Search Report and Written Opinion for App. Ser. No. PCT/US2017/040946, dated Sep. 14, 2017, 8 pages.

(Continued)

*Primary Examiner* — Minh N Trinh
(74) *Attorney, Agent, or Firm* — Cesari and McKenna, LLP

(57) ABSTRACT

The present disclosure provides an intelligent lighting control system including a releasable faceplate. The faceplate is used for installation of at least one base module. The base module has a base housing that forms a well and includes a first connector positioned in the well. The base module further includes a power terminal configured to receive electrical current and a dimmer circuit configured to modulate a flow of the electrical current to a load terminal coupled to a lighting circuit. A switch controller is mounted in the faceplate and includes a second connector configured to electrically engage with the first connector when the faceplate is pivoted to the base module. The switch controller is further configured to send one or more commands to the base module to control the dimmer circuit.

19 Claims, 18 Drawing Sheets

Removal, replacement or deactivation of hidden switch

(51) Int. Cl.

| | | |
|---|---|---|
| *H05B 47/12* | (2020.01) | |
| *G01R 19/165* | (2006.01) | |
| *H01H 21/22* | (2006.01) | |
| *H02G 3/12* | (2006.01) | |
| *H02G 3/14* | (2006.01) | |
| *H03K 17/96* | (2006.01) | |
| *H05K 1/18* | (2006.01) | |
| *H05B 47/19* | (2020.01) | |

(52) U.S. Cl.
CPC .............. *H02G 3/14* (2013.01); *H03K 17/962* (2013.01); *H05B 47/11* (2020.01); *H05B 47/12* (2020.01); *H05K 1/18* (2013.01); *H01H 2300/03* (2013.01); *H05B 47/19* (2020.01)

(56) References Cited

U.S. PATENT DOCUMENTS

| | | | | |
|---|---|---|---|---|
| 7,641,491 | B2* | 1/2010 | Altonen | H01R 13/641 |
| | | | | 439/131 |
| 7,906,873 | B1 | 3/2011 | Roosli et al. | |
| 8,149,591 | B2* | 4/2012 | Feldstein | H01H 9/0271 |
| | | | | 361/810 |
| 9,839,099 | B2* | 12/2017 | Lark, Jr. | H01H 3/02 |
| 2003/0124022 | A1* | 7/2003 | Georges | A61L 9/03 |
| | | | | 422/5 |
| 2003/0236010 | A1 | 12/2003 | Gorman | |
| 2005/0125083 | A1 | 6/2005 | Kiko | |
| 2007/0159815 | A1 | 7/2007 | Bayat et al. | |
| 2008/0258644 | A1 | 10/2008 | Altonen et al. | |
| 2012/0068894 | A1* | 3/2012 | Feldstein | H01Q 1/22 |
| | | | | 343/702 |
| 2013/0106199 | A1 | 5/2013 | Forrest | |
| 2014/0320312 | A1 | 10/2014 | Sager et al. | |
| 2015/0382436 | A1* | 12/2015 | Kelly | H05B 47/19 |
| | | | | 315/131 |
| 2016/0111878 | A1 | 4/2016 | Qureshi et al. | |
| 2017/0141505 | A1 | 5/2017 | Forti et al. | |
| 2017/0271921 | A1 | 9/2017 | Lombardi et al. | |
| 2018/0012710 | A1* | 1/2018 | Lark, Jr. | G01R 19/165 |
| 2018/0070431 | A1* | 3/2018 | Charlton | H04L 12/282 |
| 2019/0182935 | A1* | 6/2019 | Lark, Jr. | H05B 37/0272 |

OTHER PUBLICATIONS

International Preliminary Report on Patentability for App. Ser No. PCT/US2017/040946, dated Jan. 17, 2019, 7 pages.

\* cited by examiner

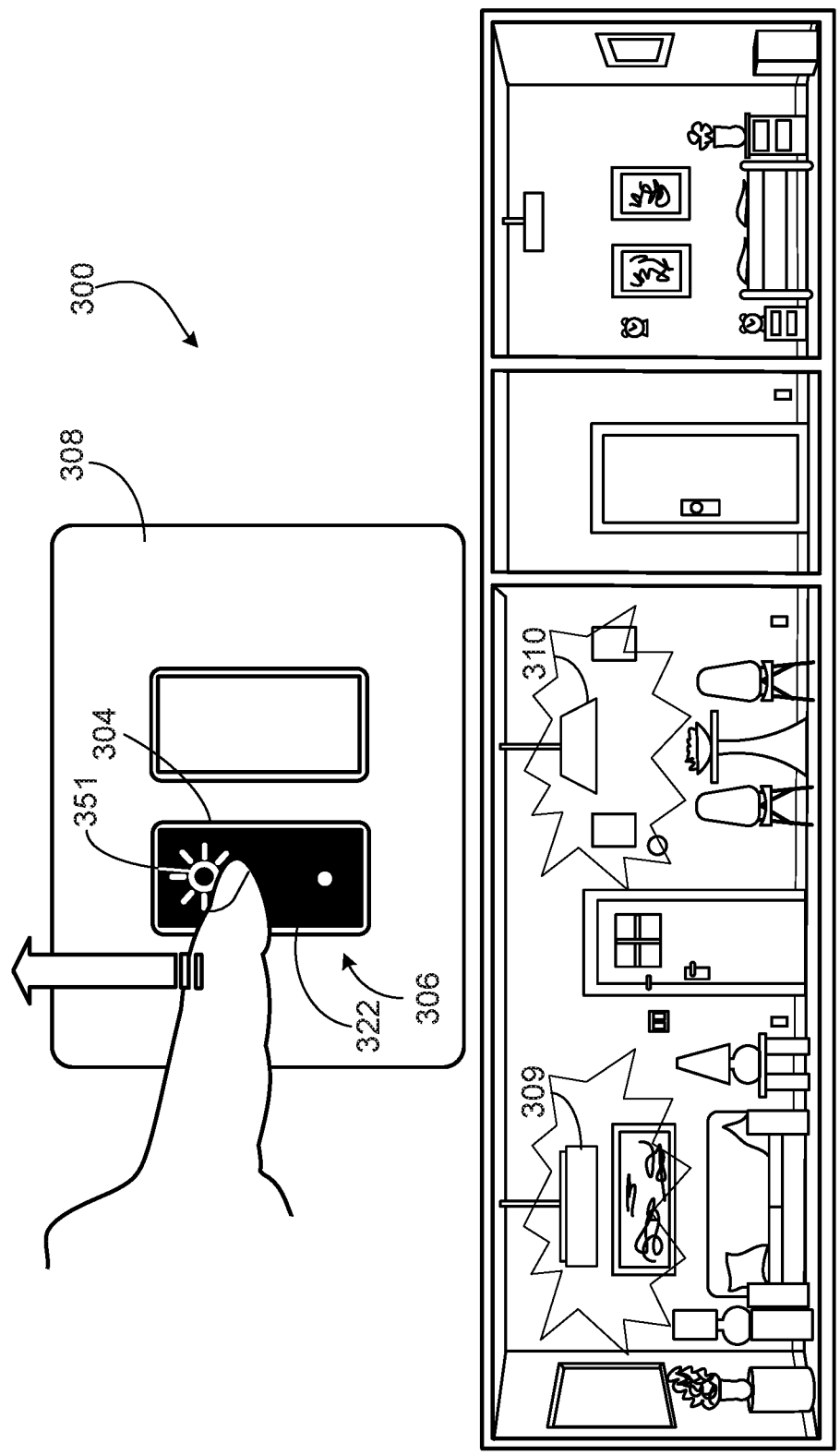

- Primarily changes plastic casing of switch module and antenna
- Functionality of sample switch, without button
- Uses Noon standard interface (TBC)
- Leverages magnetic wall plate
- Reset button accessible from front (once wall plate is removed)
- No tool necessary for airgap

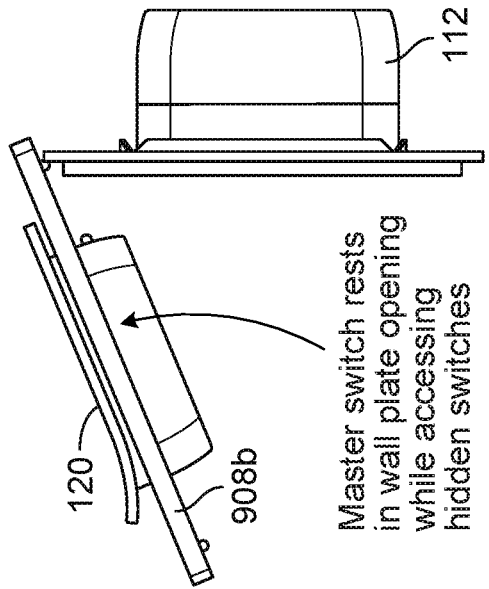
FIG. 10C
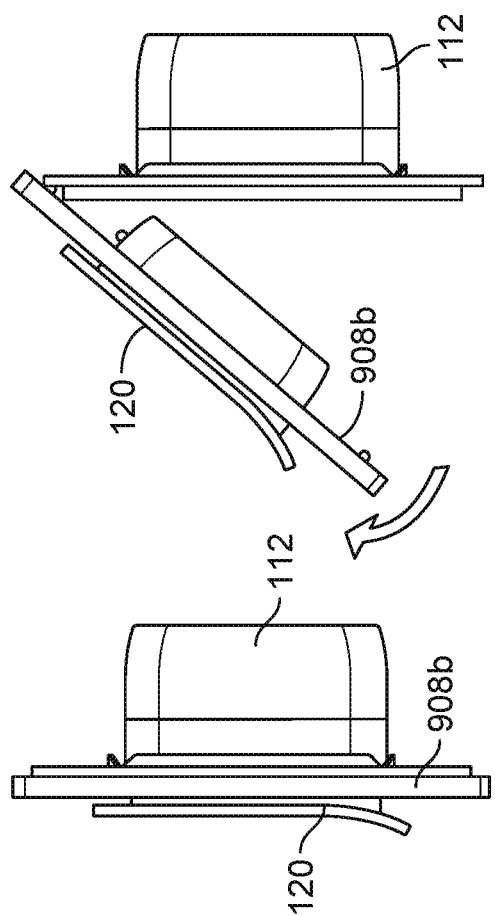
FIG. 10B
FIG. 10A

Removal, replacement or deactivation of hidden switch

INTELLIGENT LIGHTING CONTROL SYSTEM INCLUDING RELEASABLE FACEPLATE

RELATED APPLICATION

The present application claims priority to U.S. Provisional Patent Application 62/359,697, filed on Jul. 7, 2016, entitled "INTELLIGENT LIGHTING CONTROL SYSTEM SCALABLE WALL-PLATE APPARATUSES, SYSTEMS, AND METHODS," and U.S. Provisional Patent Application 62/360,253, filed on Jul. 8, 2016, entitled "INTELLIGENT LIGHTING CONTROL SYSTEM SCALABLE WALL-PLATE APPARATUSES, SYSTEMS, AND METHODS," which applications are incorporated herein by reference in their entireties.

TECHNICAL FIELD

The present application relates generally to the field of lighting control systems.

BACKGROUND

Customizing and automating home lighting control devices is often epitomized by the installation of unsightly lighting switches that are inundated with light switches confusingly mapped to respective fixtures. Automated home lighting control systems can also include large, complex, expensive central hubs that require expert or skilled technicians for installation and/or operation. Smart light bulbs and/or Wi-Fi enabled lightbulbs introduced into any of these contexts or even in simpler ones can disadvantageously be limited by the light switch that it is associated with and/or the lighting fixture itself. For example, if a light switch associated with a smart light bulb is switched off the smart light bulb becomes inoperable.

SUMMARY

The inventors have appreciated that various embodiments disclosed herein provide apparatuses, systems, and methods for concealing intelligent lighting control system components.

Various embodiments provide methods of operating a lighting control system. The methods include installing a plurality of bases modules in a multi-gang electrical box. The base modules include a base housing forming a well and including a first electrical connector positioned in the well. The first electrical connector is connected to a power circuit that is configured to receive current from an A.C. power supply and is configured for electrical coupling with a lighting circuit of a light fixture. The method includes nesting a first light control module of a plurality of light control modules in a first base module of the plurality of base modules. The light control modules include a module housing and a second electrical connector configured for engagement with and electrical coupling to the first electrical connector of a base module when nested. A switch control circuit is positioned in the housing and includes a processor or controller configured to modulate the flow of electrical energy to the lighting circuit via a dimmer circuit to produce a plurality of lighting scenes by varying the quantity of illumination of the light bulb. The switch control circuit is electrically connected to the second electrical connector. The method includes connecting a wall-plate cover to the plurality of base modules such that the nested first light control module positioned in a recess formed in a back surface of the wall-plate cover and such that an aperture in the wall-plate cover is positioned over a well in a second base module of the plurality of base modules. The method includes nesting a second light control module in the second base module by inserting a housing of the second light control module through the aperture and into the well of the second base module.

In some implementations, the lighting control module includes an antenna.

In some implementations, the lighting control module includes a camera.

In some implementations, the lighting control module includes a light sensor.

In some implementations, the lighting control module includes a microphone.

In some implementations, the lighting control module includes a thermometer

In some implementations, the lighting control module includes a humidity sensor

In some implementations, the lighting control module includes an air quality sensor In some implementations, the method includes communicably coupling the first light control module and the second control module (e.g. electronic pairing)

In some implementations, the first light control module is wirelessly connected to the second light control module.

In some implementations, the lighting control module includes configuring the second light control module as a master switch and the first light control module as the slave switch, wherein the slave switch is configured to transmit a lighting change request received by the slave switch to the master switch.

In some implementations, the lighting control module includes engaging a latch on the second light control module with a recess in the aperture where the second light control module is inserted through the aperture in the wall-plate cover.

Various embodiments, provide a wall-plate system according to any one of the preceding claims. The wall-plate can include one or more magnets disposed therein. In certain embodiments, a magnet or magnetically attracted fastener can be positioned in the wall-plate cover on a back side of the wall-plate cover. The wall-plate cover can also include a hinge for pivotally coupling with a base module. The wall-plate cover can be configured to unnest an exposed switch controller upon pivoting while leaving one or more concealed switch controllers nested in the controller(s) respective base module.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 3A-3F illustrate a lighting control device transitioning through various lighting settings and a room having lighting fixtures controlled by the lighting control device.

FIGS. 10A-10C show operation of the wall-plate system.

The features and advantages of the inventive subject matter disclosed herein will become more apparent from the detailed description set forth below when taken in conjunction with the drawings.

DETAILED DESCRIPTION

Following below are more detailed descriptions of various concepts related to, and exemplary embodiments of, inventive systems, methods and components of lighting control devices.

Figure 1A:
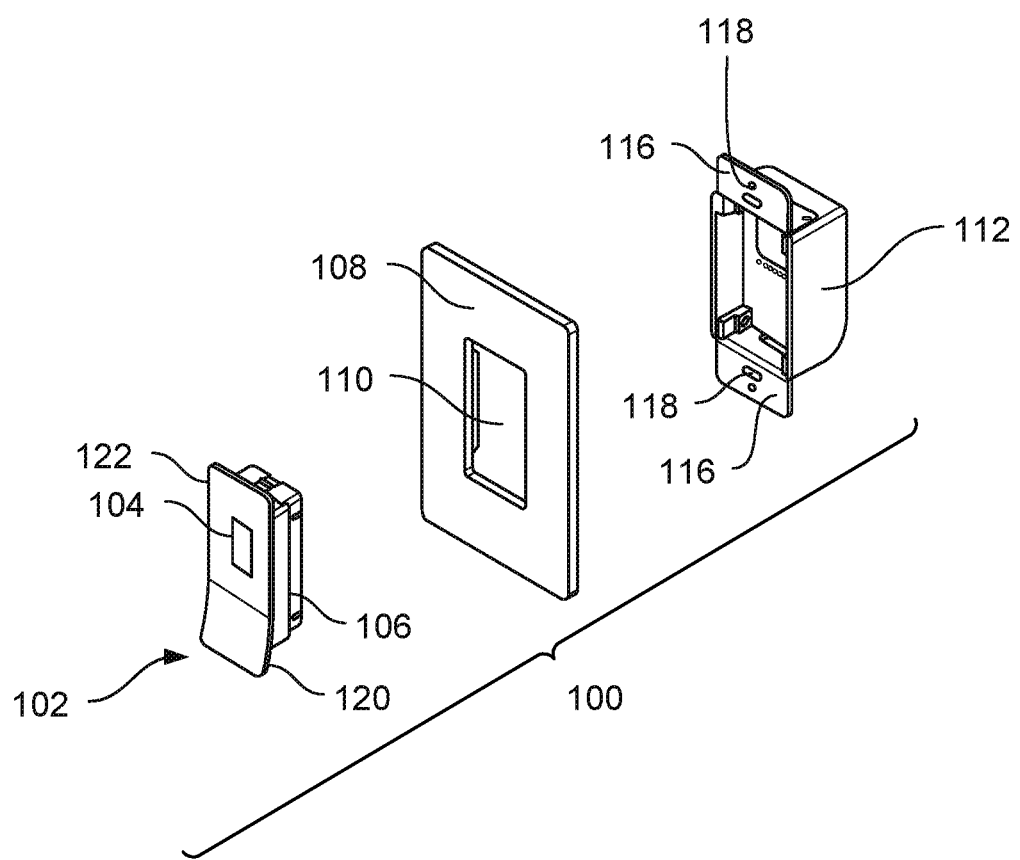
FIG. 1A is a perspective partially exploded view of a lighting control device.

FIG. 1A is a perspective partially exploded view of a lighting control device 100. The lighting control device 100 includes a switch module 102 including a light switch actuator 106 and a tactile display 104 housed in the light switch actuator 106. The lighting control device 100 also includes a wall-plate cover 108 including a switch module opening 110 extending therethrough. The lighting control device 100 also includes a base module 112 configured for coupling to the switch module 102 via multi-pin socket 114. The base module 112 is sized and configured for receipt within a one-gang wall electrical box and has a volume corresponding substantially thereto. The base module 112 is configured to be coupled to a wall electrical box via connection tabs 116 and fastener apertures 118 in the connection tabs 116.

The light switch actuator 106 includes an outer actuation surface 122, which as discussed further herein may be composed of glass. The actuation surface 122 is movable, for example, by pushing on the curved foot 120 to cause the light switch actuator 106 to pivot, for example. The pivoting of the light switch actuator 106 and the actuation surface 122 causes a contact component (shown in FIG. 2) of the switch actuator 106 to move from a first position to a second position. Movement of the contact component causes a connection of an electrical flow path, for example by allowing two electrical contacts to connect or by connecting the contact component with an electrical contact. The connecting of the electrical flow path, permits electrical energy supplied by a power source connected to the base module 112 to energize or activate the tactile display 104, as discussed in further detail herein. The tactile display 104 is structured in the switch module to move contemporaneously with at least a portion of the actuation surface 122 and with the actuator 106. When activated or energized, the tactile display 104 allows a user to define or select predefined lighting settings where the lighting settings change the voltage or power supplied to one or more light fixtures. The change in power supplied to the light fixtures may include a plurality of different voltages supplied to each fixture and may be based on various parameters including, but not limited to, location, light intensity, light color, type of bulb, type of light, ambient light levels, time of day, kind of activity, room temperature, noise level, energy costs, user proximity, user identity, or various other parameters which may be specified or detected. Furthermore, the lighting control device 100 may be connected to all of the lights in a room or even in a house and can be configured to operate cooperatively with one or more other lighting control devices 100 located in a unit or room and connected to the same or distinct lighting fixtures.

Figure 1B:
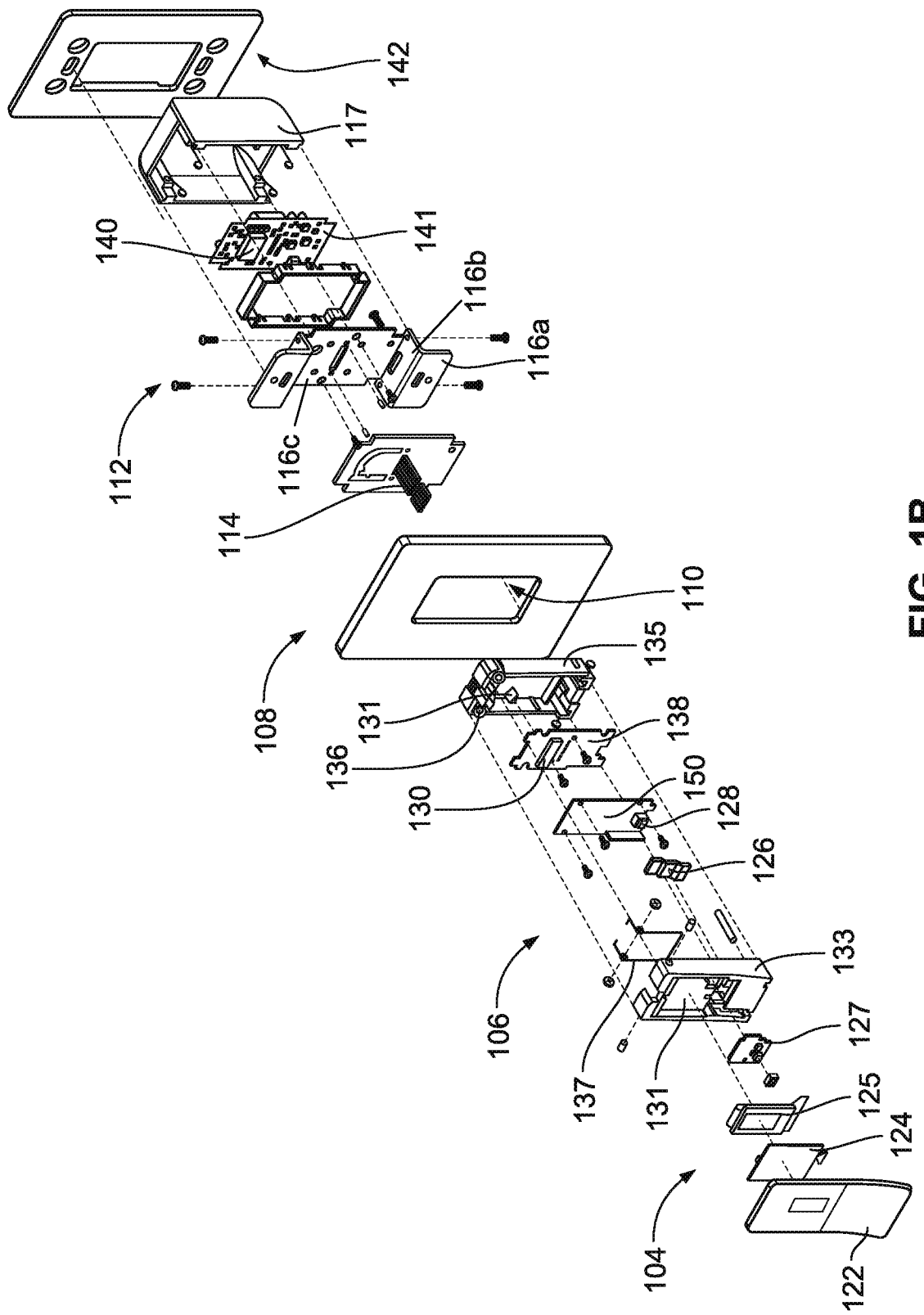
FIG. 1B is a fully exploded view of the lighting control device of FIG. 1A

FIG. 1B is a fully exploded view of the lighting control device 100 of FIG. 1A. As demonstrated in FIG. 1B, the tactile display 104 is positioned between the outer actuation surface 122 and the light switch actuator 106. The actuation surface 122 may be composed of an impact-resistant glass material permitting light from the tactile display 104 and/or a clear sight of path for sensors 127 or other lights, such as a light from light pipe 126 indicating activation to pass through the actuation surface 122. The tactile display 104 is composed of a polymer-based capacitive touch layer 124 and a light emitting diode panel 125, which are controlled via one or more modules, processors, or controllers positioned on the printed circuit board 150. The tactile display 104 is housed within a recess 131 of the light switch actuator 106 beneath the actuation surface 122. The light switch actuator 106 may be formed as a thermoplastic housing including a housing cover 133 and a housing base 135. The light switch actuator housing cover 133 is pivotally connected to the housing base 135 via pins and the housing cover 133 is biased with respect the housing base 135 via torsion spring 137. In particular embodiments, the light switch actuator housing cover 133 may be configured to slide or otherwise translate or rotate. The outer actuation surface 122 is biased with the switch actuator housing cover 133 and moves contemporaneously therewith in concert with the tactile display 104 housed in the cover component 133 of the light switch actuator 106. The light switch actuator 106 includes a switch pin 128 movable between positions to close an open circuit on the primary printed circuit board substrate 150, which board also houses a switch controller or processor. In certain embodiments the light switch actuator 106 may include a circuit board stack, including the primary printed circuit board substrate 150 and a secondary printed circuit board 138 The light switch actuator 106 may include a latch 136 for coupling to the base module 112 (e.g. as the light switch actuator 106 is passed through the opening 110 in the wall-plate cover 108), which latch causes the light switch actuator 106 to click into place. The housing base 135 includes a multi-pin connector or plug configured to engage the multi-pin socket 114 of the base module 112.

The lighting control device 100 includes a mounting chassis 142 configured to be installed to an electrical wall box. The mounting chassis 142 creates an even surface for installation of the other modules (e.g., the base module 112 and the switch module 102). Once the base module is connected to the electrical wall box via the mounting chassis 142, the wall plate cover 108 can be coupled to the mounting chassis 142 and the light switch actuator 106 can be inserted through the switch module opening 110. In particular embodiments, the wall plate cover can be coupled to the mounting chassis 142 and/or the tabs 116 of the base module via magnets. The magnets may be recessed within openings of a portion of the wall plate cover 108. As noted, the base module 112 is configured to be coupled to the mounting chassis 142 via connection tabs 116. The base module 112 is further configured to be electrically coupled to a power source (e.g., an electrical wire coming from an electrical breaker box to the electrical wall box) and to one or more light fixtures wired to the electrical box. Accordingly, the base module 112 provides an interface between a power source, the light switch actuator 106, and one or more light fixtures. The base module includes a processor 140 and a circuit board 141 for managing the power supplied by the power source and routed to the one or more light fixtures in accordance with a light setting selection identified via the light switch actuator 106 or the tactile display 104.

One or more of the processors on the printed circuit board 150 or 138 and the base module processor 140 may include wireless links for communication with one or more remote electronic device such as a mobile phone, a tablet, a laptop, another mobile computing devices, one or more other lighting control devices 100 or other electronic devices operating in a location. In certain implementations the wireless links permit communication with one or more devices including, but not limited to smart light bulbs, thermostats, garage door openers, door locks, remote controls, televisions, security systems, security cameras, smoke detectors, video game consoles, robotic systems, or other communication enabled sensing and/or actuation devices or appliances.

The wireless links may include BLUETOOTH classes, Wi-Fi. Bluetooth-low-energy, also known as BLE (BLE and BT classic are completely different protocols that just share the branding), 802.15.4, Worldwide Interoperability for Microwave Access (WiMAX), an infrared channel or satellite band. The wireless links may also include any cellular network standards used to communicate among mobile devices, including, but not limited to, standards that qualify as 1G, 2G, 3G, or 4G. The network standards may qualify as one or more generation of mobile telecommunication standards by fulfilling a specification or standards such as the specifications maintained by International Telecommunication Union. The 3G standards, for example, may correspond to the International Mobile Telecommunications-2000 (IMT-2000) specification, and the 4G standards may correspond to the International Mobile Telecommunications Advanced (IMTAdvanced) specification. Examples of cellular network standards include AMPS, GSM, GPRS, UMTS, LTE, LTE Advanced, Mobile WiMAX, and WiMAX-Advanced. Cellular network standards may use various channel access methods e.g. FDMA, TDMA, CDMA, or SDMA. In some embodiments, different types of data may be transmitted via different links and standards. In other embodiments, the same types of data may be transmitted via different links and standards.

Figure 2A:
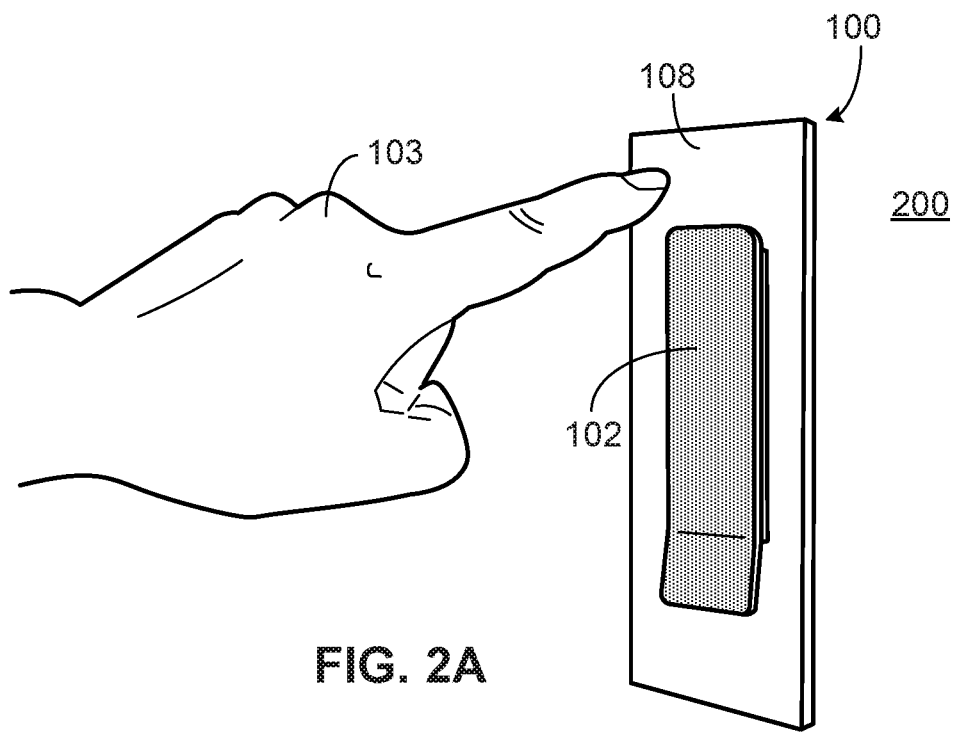
FIG. 2A shows the lighting control device of FIG. 1A mounted on a wall.

FIG. 2A shows the lighting control device 100 of FIG. 1A mounted on a wall 200. As demonstrated in FIG. 2A, the base module 112 is not visible upon installation of the lighting control device 100 in view of the wall-plate cover 108. Because the wall-plate cover 108 attaches to the base module 112, the wall-plate cover 108 appears to be floating on the wall 200. The lighting control device 100 may be activated by a user 103 interacting with the outer actuation surface 122 and the tactile display 104.

Figure 2B:
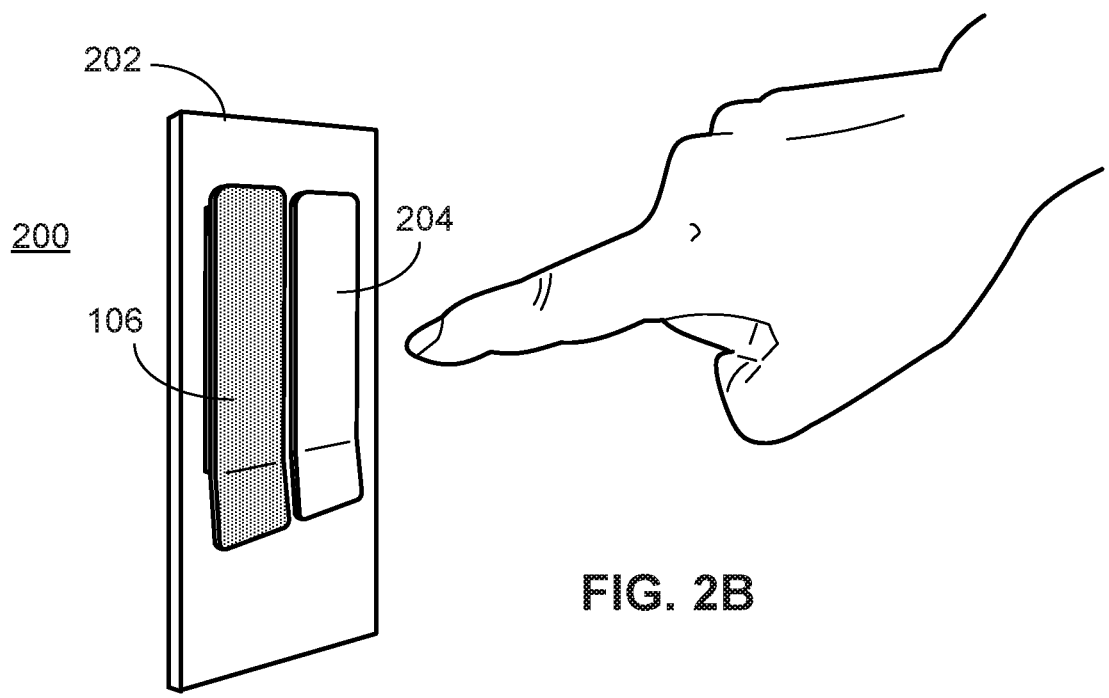
FIGS. 2B and 2C illustrate multi-switch lighting control devices.
Figure 2C:
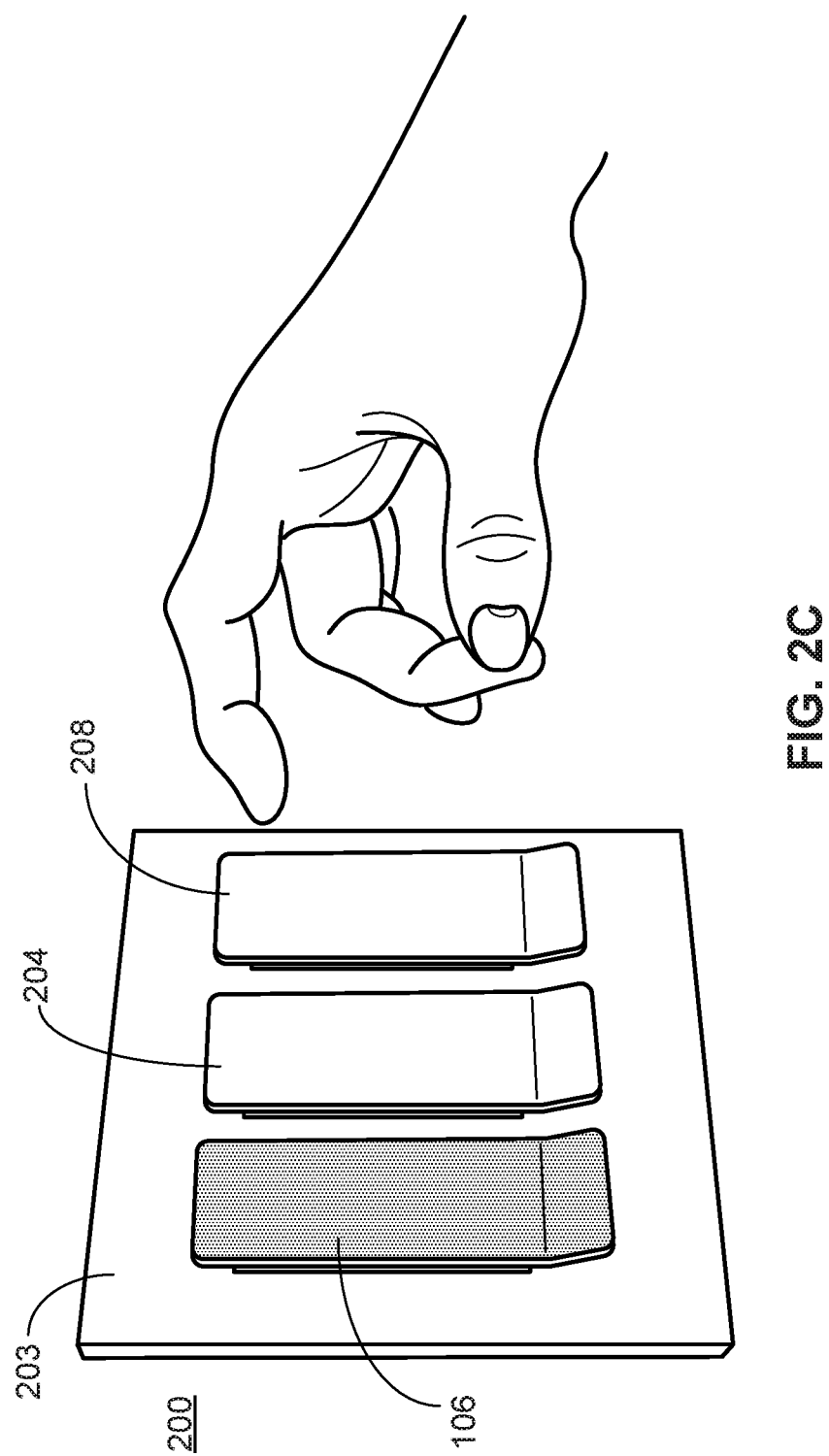

FIGS. 2B and 2C illustrate multi-switch configurations of multiple lighting control device. FIGS. 2B and 2C illustrate a two switch and three switch embodiment respectively where the lighting control devices 202 and 203 each include a light switch actuator 106 as well as auxiliary switches 204 and 208, as well as 2 and 3 base modules 112, respectively.

FIGS. 3A-3F illustrate a lighting control device transitioning through various lighting settings and a room having lighting fixtures controlled by the lighting control device.

Figure 3A:
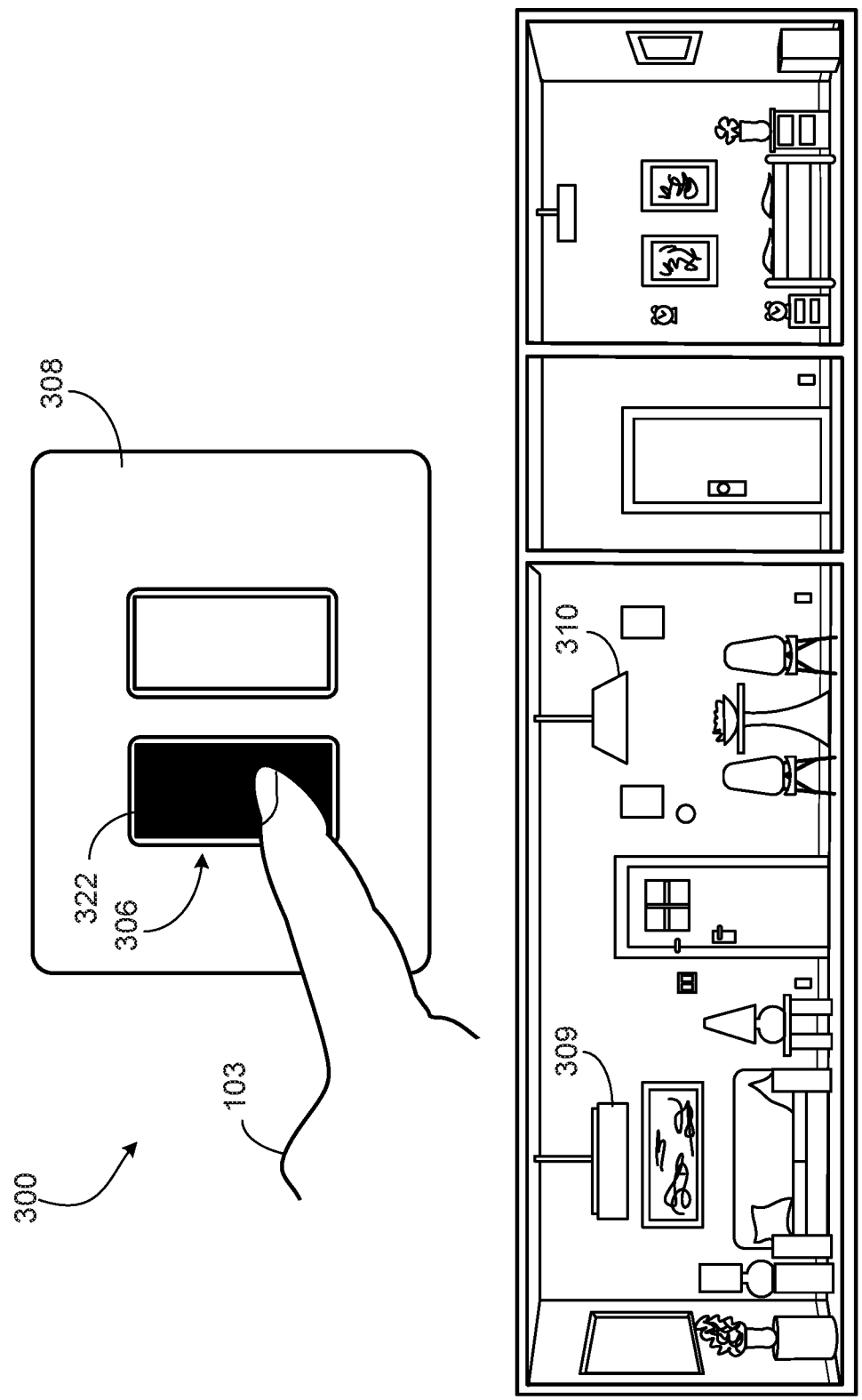
Figure 3B:
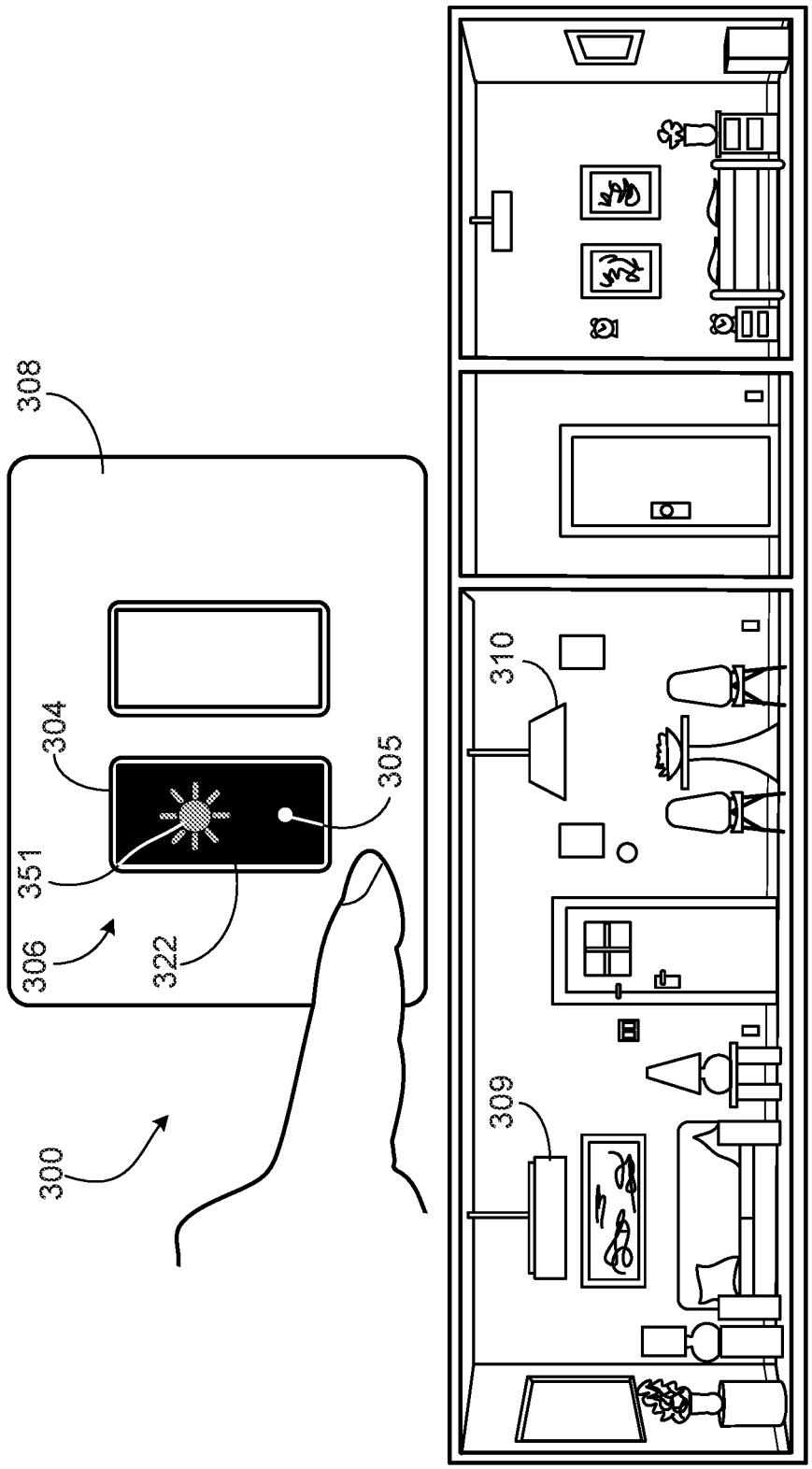
Figure 3C:
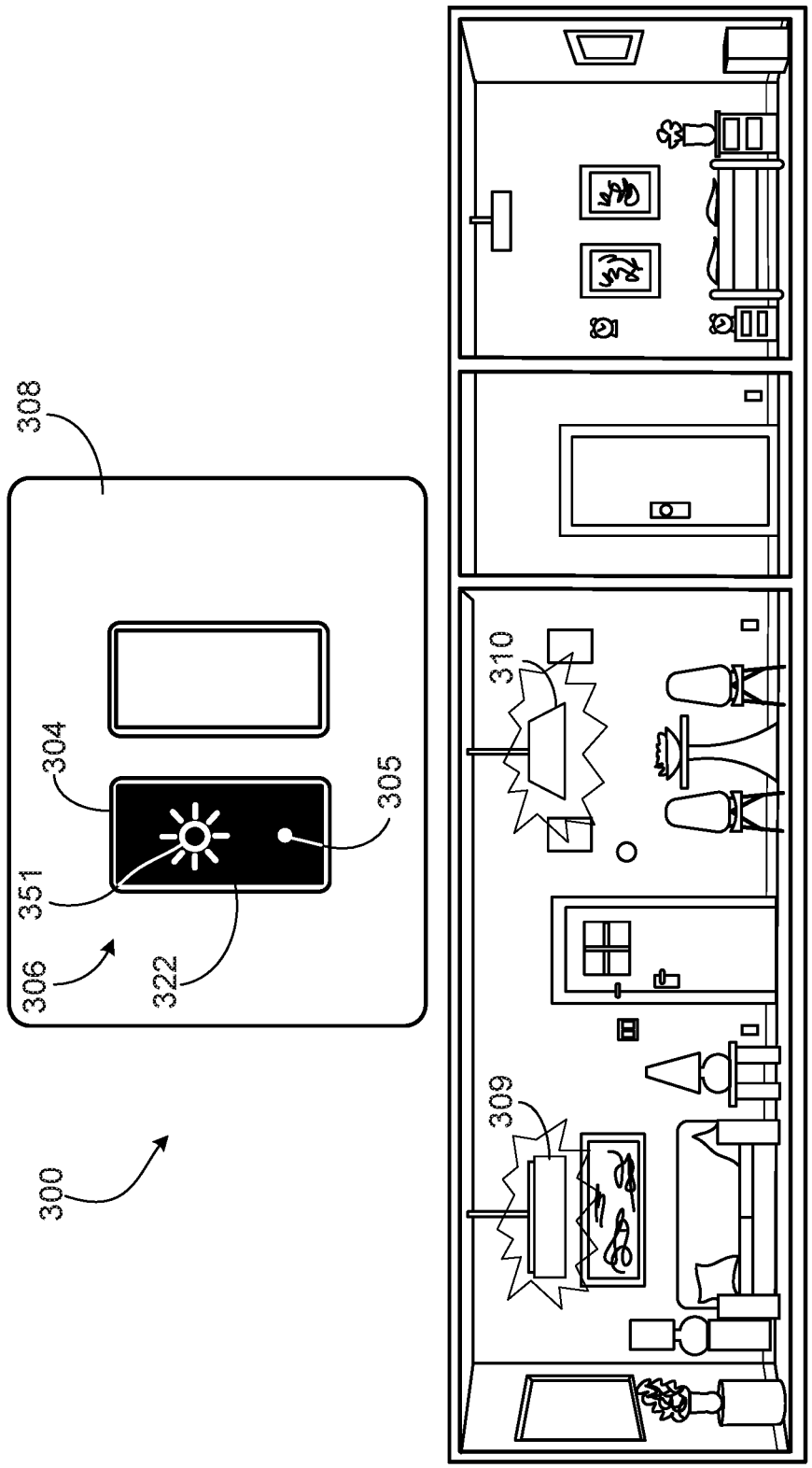
Figure 3E:
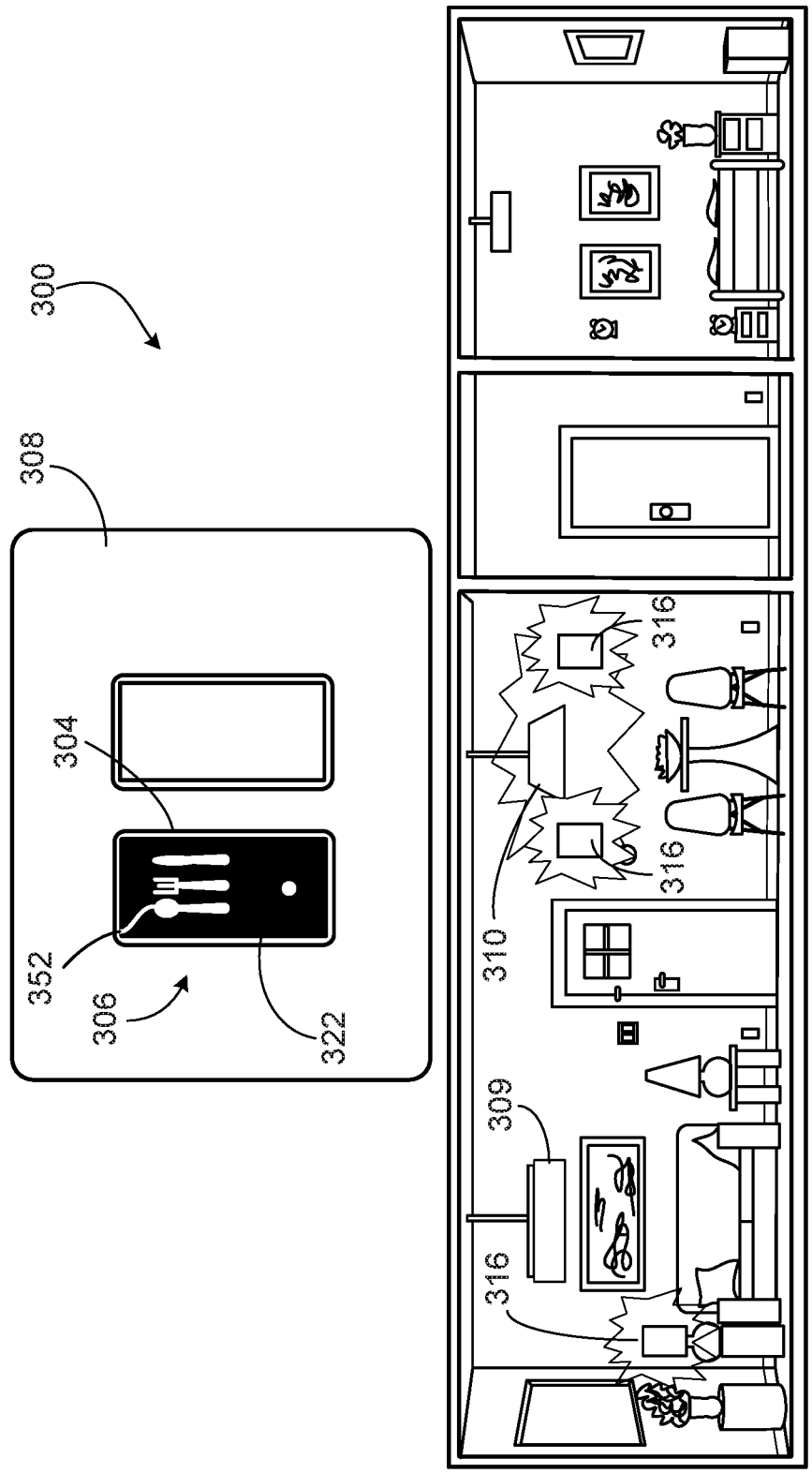
Figure 3F:
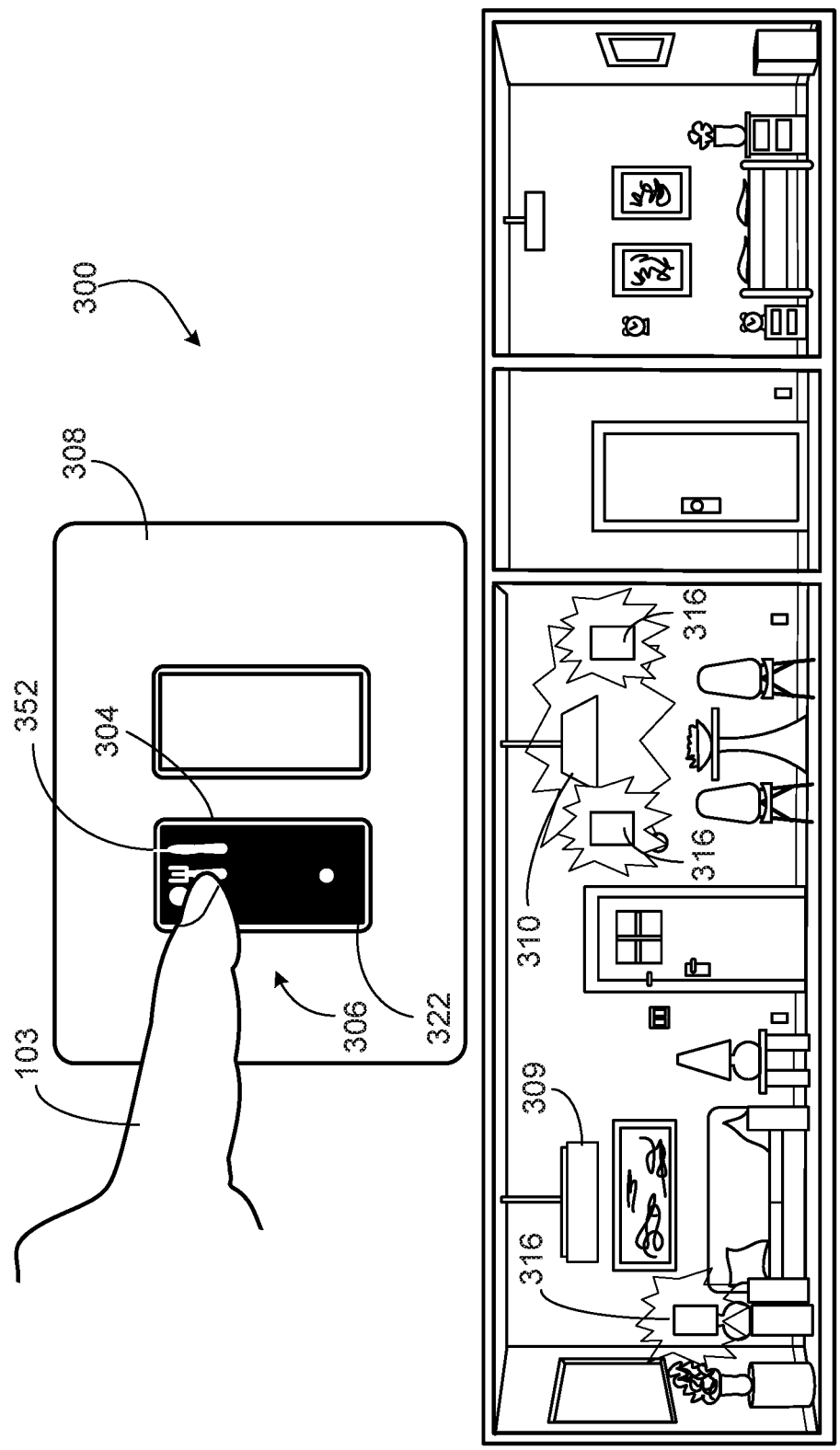

In FIG. 3A, the lighting control device 300 is connected to a base module positioned behind the wall-plate 308. The lighting control device 300 includes a dynamic light switch actuator 306, operable in a manner similar to the light switch actuator discussed in connection with FIGS. 1A-2C, and an auxiliary light switch actuator. As demonstrated in FIG. 3A by the unilluminated outer actuation surface 322 of the light switch actuator 306 is inactive and not energized. In response to a user 103 moving the actuation surface 322 of the light switch actuator 306, the light switch actuator 306 begins to become energized, as shown in FIG. 3B. The energization or activation of the light switch actuator 306 is signaled by the power light indicator 305 and by full lighting setting icon 351. As shown in FIG. 3C where the icon 351 is fully lit (rather than partially lit as in FIG. 3B), the light switch actuator 306 is fully energized. In this particular configuration, the primary lights 309 and 310 are illuminated at full power. FIG. 3D shows the transition between lighting settings. As demonstrated in FIG. 3D, this transition is facilitated via user 103 completing swiping gesture 312 across the tactile display 304 and along the actuation surface 322. As the user completes the gesture 312, the icon 351 is swiped from the tactile display 304 as the tactile display toggles to a new light setting shown in FIG. 3E. The new light setting shown in FIG. 3E is represented or identified by the dinner icon 352. The new light setting shown in FIG. 3 has the light fixture 309 powered down and has caused lamp 316 and sconces 318 to become illuminated to change the lighting scene in the room. The change in the light setting causes a change in distribution of power to certain lighting fixture based on the selected lighting setting. The light switch actuator 306 may be pre-programmed with a plurality of lighting settings or may be configured with particular lighting settings as specified by the user 103. A further swiping gesture 315 shown in FIG. 3F or a different gesture are used to transition from the lighting setting of FIG. 3F represented by icon 352 to a further lighting setting.

Figure 4:
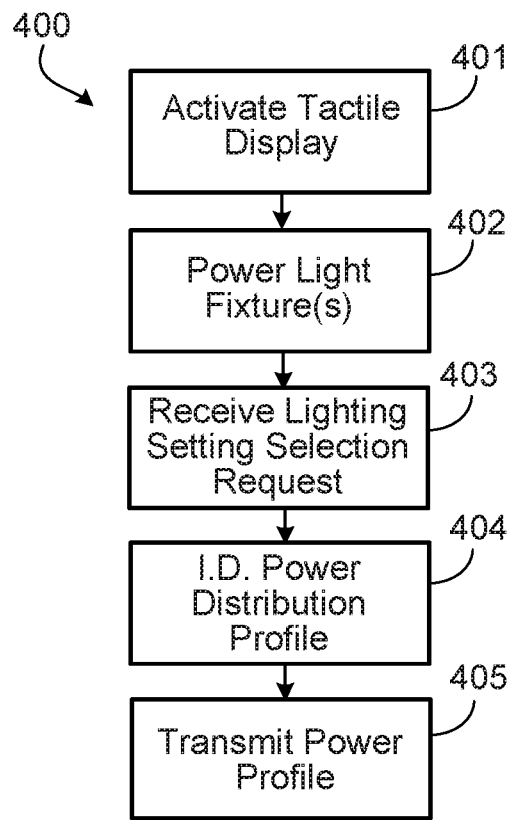
FIG. 4 provides a flow diagram of operations of a system for controlling a lighting control device.

FIG. 4 provides a flow diagram of operations of a system for controlling a lighting control device. FIG. 4 illustrates control operations of a control system, such as processor 140 configured to control the lighting control device 100 or 300, in accordance with various embodiments of the present invention. At 401, the tactile display housed in the light switch actuator is activated by moving the light switch actuator, for example by moving the actuation surface of the light switch actuator. At 402, the light fixtures electrically coupled to the light switch actuator via a base module are powered as the movement of the light switch actuator causes a contact component to move into a new position and thereby permit or cause an electrical flow path between a power source and the light fixture(s) to be closed. The tactile display housed in the light switch actuator is moved contemporaneously with the actuation surface. At 403, a lighting setting selection request is received via the tactile display, for example by a particular motion or motions on the tactile display. The lighting setting selection request identifies a lighting setting from among a plurality of lighting settings. A user may swipe multiple times to toggle through the plurality of lighting settings or may conduct a specific motion that corresponds to a particular lighting setting including, but not limited to, a half swipe and tap to achieve a light intensity of all the connected light fixtures at half of their peak output. The lighting settings identify distinct power distribution schemes for one or more light fixtures connected to the light switch module. At 404, a power distribution scheme is identified. At 405, the identified power distribution scheme is transmitted, for example by the base module responding to control signals from the light switch actuator, to adjust one, some, or all of the lights based on the power distribution scheme corresponding to the lighting setting selected. The power distribution schemes or profiles may be stored in a memory device of the lighting control device. In certain embodiments, the power distribution schemes may be adjusted to account for other parameters such as ambient lighting from natural light or an unconnected source. In certain embodiments the power distribution schemes may be adjusted based on one or more other sensor parameters. In particular embodiments, the lighting setting may be adjusted by automation based on time of day, sensed parameters such as light, temperature, noise, or activation of other devices including, but not limited to, any electronic device described herein.

Figure 5:
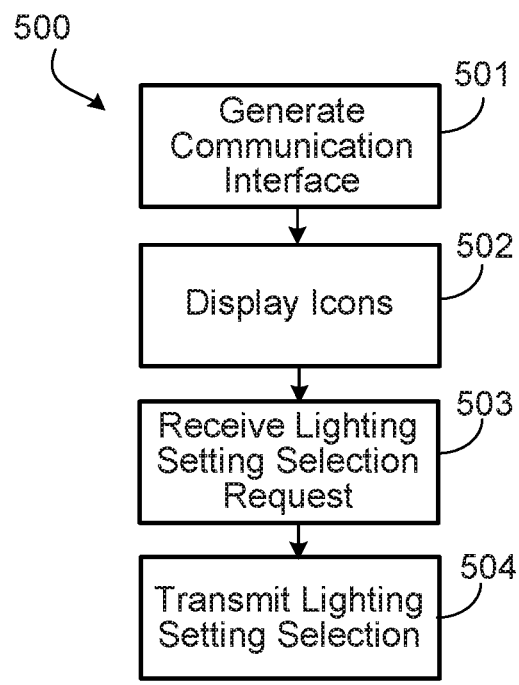
FIG. 5 shows a flow diagram of a system for remotely operating a lighting control device.

FIG. 5 shows a flow diagram of system for remotely operating a lighting control device. In particular embodiments, the lighting control device 100 or 300 may be operable from a remote device if the actuator switch is activated or energized. In such instances, the remote device may include one or more computer program applications, such as system 500, operating on the device to communicate with and control the lighting control device. Accordingly, at 501, the control system 500 initiates a connection module to generate a communication interface between a mobile electronic device and a light switch module. The connection module may cause the remote device to send one or more wireless transmission to the lighting control device via a communication protocol. At 502, the control system 500 causes the remote device to generate a display of icons on a display device of the mobile electronic device to facilitate selection of a lighting setting. At 503, the control system 500 receives a lighting setting selection based on the user selecting a particular icon. At 504, a transmission module causes the lighting setting selected to be transmitted to the lighting control device so that the light switch module and/or the base module can cause the power distribution scheme corresponding to the lighting setting to be transmitted to the lighting fixtures. The tactile display of the lighting control device may be updated in concert with receipt of the lighting setting to display the icon selected on the mobile electronic device and corresponding to the lighting setting selected on the tactile device.

Figure 6:
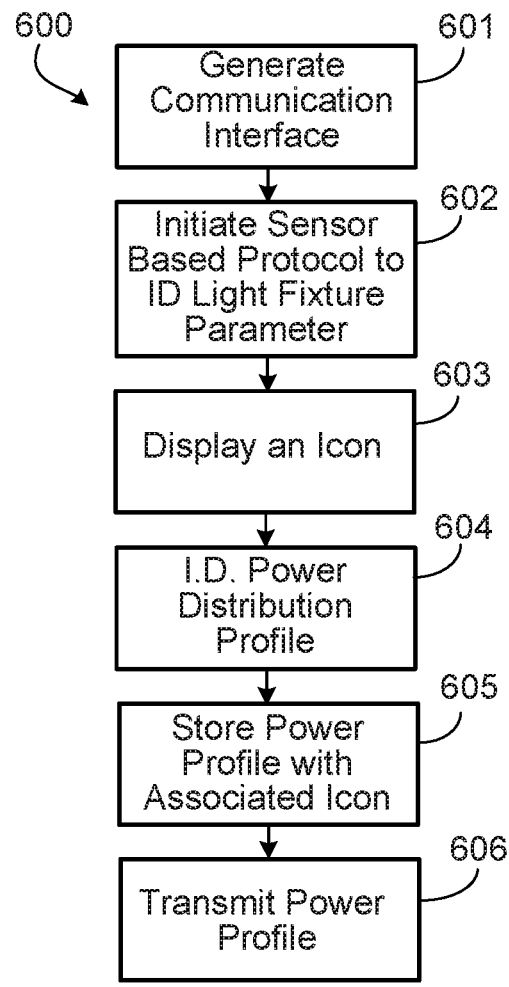
FIG. 6 illustrates a flow diagram of a system for remotely configuring operations of a lighting control device.

FIG. 6 illustrates a flow diagram of a system for remotely configuring operations of a lighting control device. The remote device may include devices including, but not limited to a mobile phone, a mobile computing device or a computing device remote from the light control device. At 601, the mobile electronic device generates a communication interface with the light switch module. At 602 a light fixture identification module initiates a sensor based protocol to identify a parameter associated with one or more light fixtures connected to the light switch control module. At 603, a display selection module causes a display of an icon to appear on a display device of the mobile electronic device. At 605, a lighting setting configuration module allows a user to create a power distribution scheme or profile for the light fixtures identified based on the identified parameters and a user specified input related to light intensity. At 604, a storage module is used to the store the power distribution scheme and associate a particular lighting setting icon with the power distribution scheme. At 606, a transmission module transmits the power distribution scheme and the associated icon to the light switch control module.

Figure 7:
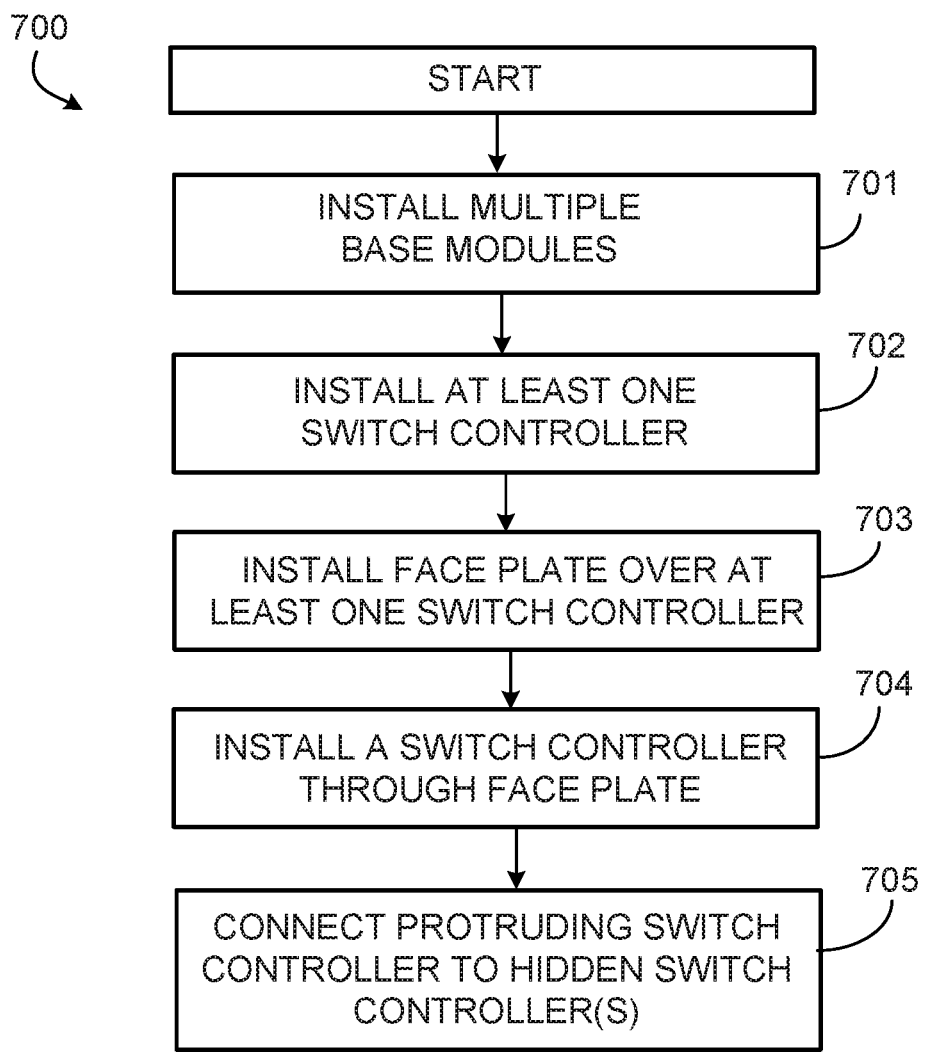
FIG. 7 is a flow diagram of a method of installing lighting control systems with an inventive wall-plate system.

FIG. 7 is a flow diagram of a method of installing a lighting control system. At 701, a plurality of base modules of lighting control systems are installed in a multi-gang electrical wall box. These may be fastened directly or indirect via one or more screws or can be coupled via other connectors. At 702, at least one switch controller is installed or nested into one of the plurality of base modules, such that at least one base module remains unoccupied. As discussed herein, nesting the switch controller in the base module causes the switch controller to be electrically connected to the respective base module. As discussed further herein, the switch controller may be configured as other switch controllers described herein, but can exclude a graphical user interface since the switch controller installed before the wall-plate will be concealed thereby. At 703, a wall-plate is installed over the switch controller(s) previously nested in a base module. The wall-plate can include magnets in wall-plate for quick and easy access to components underneath. The wall-plate can include one or more recesses for nesting a front portion of the nested switch controllers therein. The wallplate is installed at 703 such that a switch controller aperture (such as aperture 110 in FIG. 1A) is aligned with the well of one of the unoccupied base modules. At 704 a switch controller including a graphical user interface, such as a tactile display is installed through the switch controller aperture and nested in the unoccupied base module such that the graphical user interface is accessible through the wall-plate (while the other switch controllers are retained behind a surface of the wall-plate). At, 705 the switch controller protruding through the wall-plate is communicably coupled to the hidden switch controllers.

Figure 8:
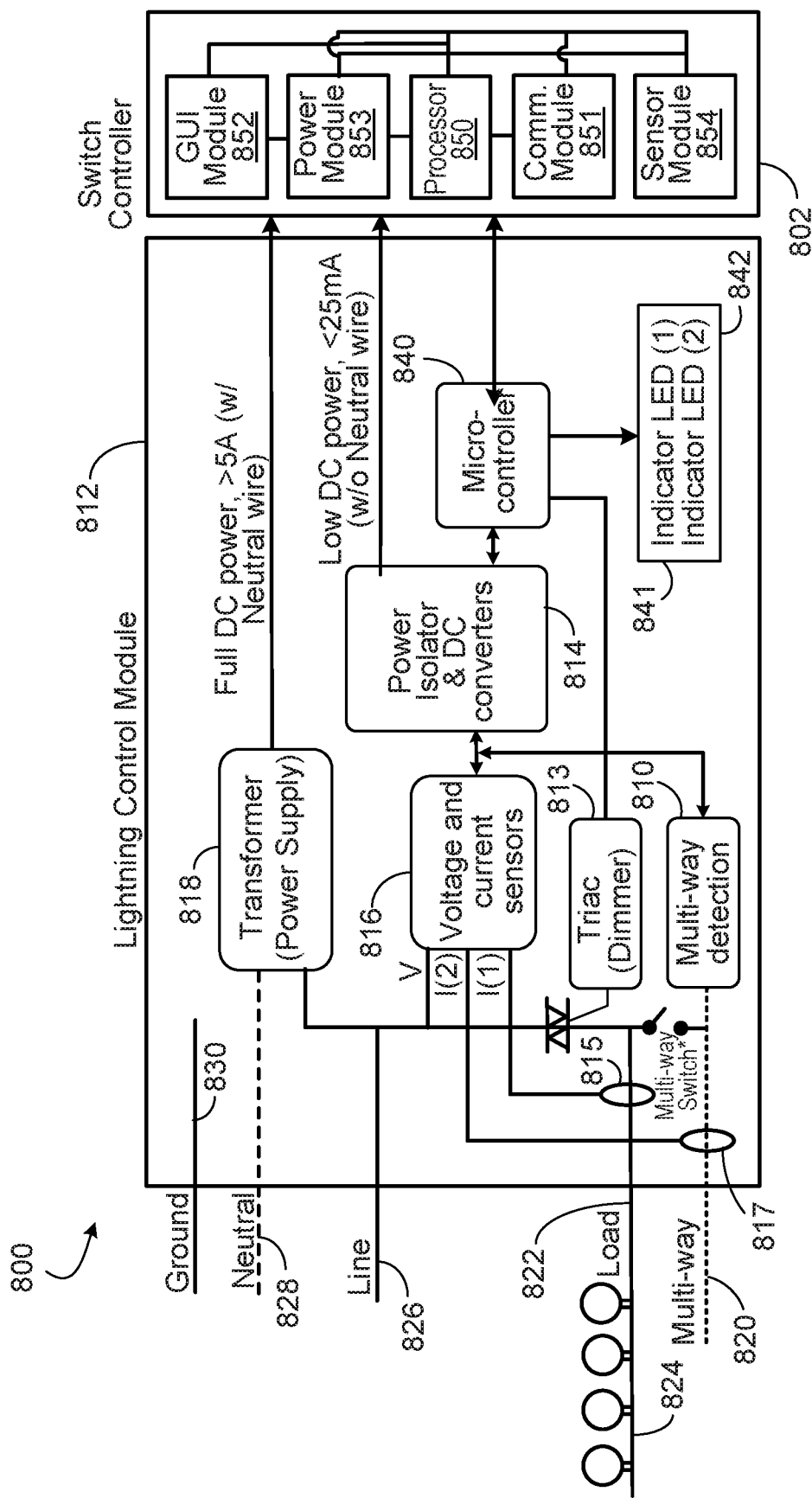
FIG. 8 is a schematic of a lighting control system.

FIG. 8 is a schematic of a lighting control system 800 configured to execute lighting control operations described herein. The lighting control system 800 illustrates lighting control system components that can be implemented with a lighting control system including an air gap system as described herein. The lighting control system 800 is depicted separated into a base lighting control module 812 (which may be configured in a manner similar to base module 112) and a switch module or switch controller 802 (which may be configured in a manner similar to switch module 102). As described herein, the switch module 802 can include a tactile interface, operable via the graphical user interface module 852, and a switch actuator, such as the tactile display 104 and the light switch actuator 106 described herein. The switch module 802 houses a processor 850 (or a microcontroller), which may be configured to send commands to microcontroller 840 and receive inputs from the microcontroller 840 to control the operation of a transformer 818, a power isolator and an AC to DC converter 814 (which may include a flyback converter), and a dimmer, such as a TRIAC dimmer 813, and a voltage and current sensor 816. In some embodiments, the base lighting control module 812 may include a MOSFET dimmer. The power isolator 814 separates the analog AC current from the low power or DC digital components in the base lighting control module 812 and the switch module 802. The power isolator 814 may provide power inputs to the switch control module 802 via a power module 853. Power module 853 includes power circuitry configured to regulate the flow of power from the base module 812 to the switch controller module 802 including directing power to one or more of the modules in the switch controller module 802. The switch module 802 also houses a communication module 851, which can include one or more antennae or other wireless communication modules. The switch module 802 also houses a sensor module 854, which can include one or more sensors, such as a light sensor, a camera, a microphone, a thermometer, a humidity sensor, and an air quality sensor. The processor 850, is communicably coupled with one or more modules in the switch module 802 to control the operation of and receive inputs from those modules, for example to control modulation of the flow of electrical energy to a lighting circuit of a light fixture 824 connected to the base lighting control module 812.

The base lighting control module 812 includes a ground terminal 830 for grounding various electrical components container in the module 812. The base light control module 812 includes a neutral terminal 828 for connecting to a neutral wire, a line terminal 826, and a load terminal 822. As shown in FIG. 8, the voltage and current sensor(s) 818 are coupled to the load line to detect changes in the voltage or current along the line carrying power to one or more light fixtures 824 connected to the lighting circuit. The base lighting control module 812 also includes a microcontroller 840 communicably coupled to the processor 850. The base lighting control module 812 also includes LED indicator lights 842 and 841 for indicating information regarding the status of the base lighting control module 812. For example, in some embodiments LED indicator light 841 can indicate if a neutral wire is connected while LED indicator light 842 can indicate if a 3 way connection is connected.

Figure 9B:
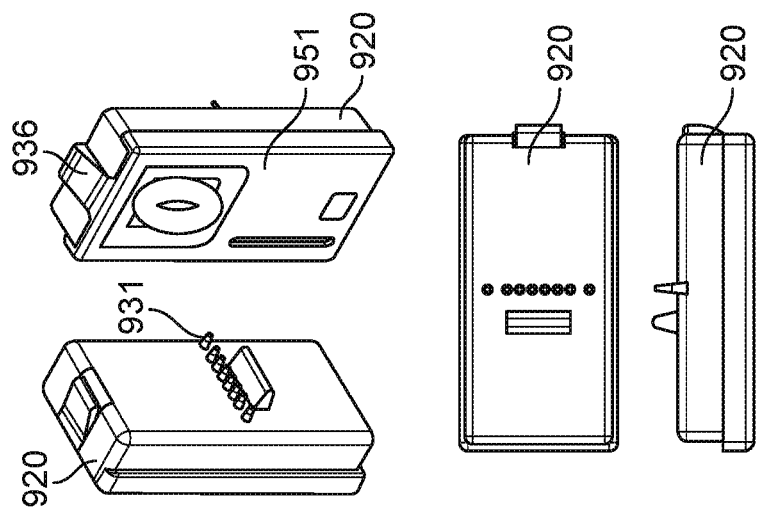
FIGS. 9A and 9B are schematics of a lighting control system including a wall-plate for concealing one or more switch controller(s).
Figure 9B:
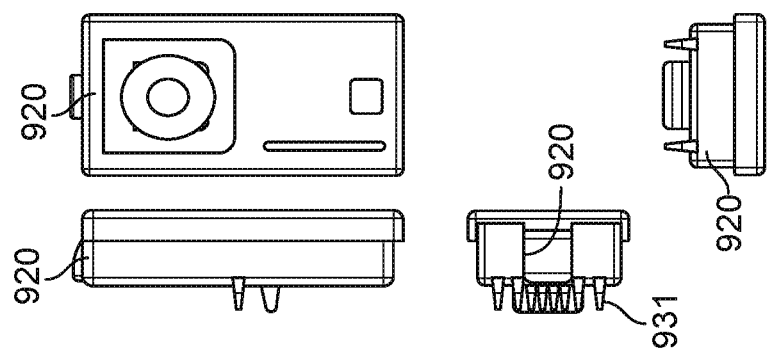
Figure 9A:
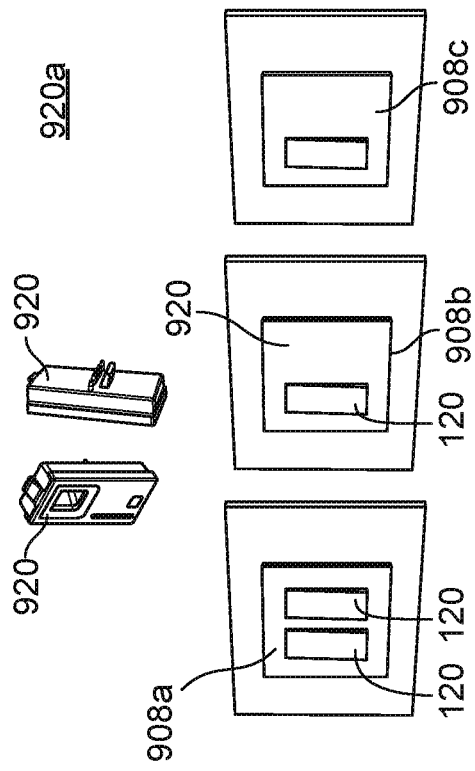

FIGS. 9A and 9B are schematics of a lighting control system including a wall-plate for concealing one or more switch controller(s). A lighting control system with a plurality of switch controllers are shown extending through a wall-plate cover 908a. The wall-plate cover 908a includes multiple openings for direct access to multiple switches. However, in accordance with inventive embodiments, one or more switch controllers 920 may be concealed behind a particular type of wall-plate such as wall-plate 908b. The wall-plate 908b conceals one switch controller 920 behind it while keeping one switch controller 120 physically, directly accessible. The wall-plate 908c may go a step further, both concealing a switch controller 920 behind it but also being configured to be recessed in the wall and to have a matching color, such that the extending switch controller 120 extending through wall-plate 908c appears to be floating on the wall. The exposed switch controller 120 can be communicably coupled to the concealed switch controller 920 either by wires or wirelessly. The exposed switch controller 120 and the concealed switch controller 920 can be configured to control distinct light circuits (e.g. circuits connected to distinct light fixtures), but can be operated collectively, such that a scene selection through the exposed switch controller 120 causes a command to be sent to the concealed switch controller 920 automatically to adjust multiple light fixtures in a room to create a specific lighting scene through one lighting scene selection input. FIG. 9B provides multiple views of the concealed switch controller 920. In general, the concealed switch controller 920 operates in a substantially similar way as switch controller 120 (e.g. sending commands from the switch controller to a base module to cause variation in electrical flow via a dimmer circuit), however the concealed switch controller 920 can exclude the graphical user interface since the switch will be concealed. This can reduce the costs of the concealed switch controller 920. The concealed switch controller 920 can still include the other electrical components described in FIGS. 1A, 1B and 8, such as a processor, a power module, an electrical connector, a communication module, etc. As demonstrated in FIG. 9B, the concealed switch controller 920 includes an electrical connector 931 configured for electrically coupling with an electrical connector of a base module. The concealed switch controller 920 includes a distinct interface cover 951, which can provide a light for easily seeing the operational status of the device and may include other sensors or electrical interfaces. The distinct interface cover 951 can also include a magnet for holding the wall-plate (e.g. wall-plate 908c or 908b) in place vis a vis a magnet or metallic connector positioned in a back face of the wall-plate cover. The concealed switch controller 920 also includes a spring biased latching mechanism 936 to assist with locking the concealed switch controller in place when nested in a base module.

FIGS. 10A-10C show operation of the wall-plate system. In FIG. 10A. The wallplate cover 908b is releasable attached to the base module 112. The exposed switch controller 120 is extending through the aperture in the wall-plate cover. The wall-plate cover 908b is pivotally connected to the base module 112, via a hinge. Accordingly, when the wall-plate 908b is pivoted away from the base module 112 (e.g. by overcoming the magnetic force of magnets holding the wall-plate to the base module and/or one or concealed switch controllers 920), the wall-plate 908b unnests and lifts the exposed switch controller 120 from the respective base module that it is nested in as shown in FIGS. 10B and 10C. In certain embodiments the exposed switch controller 120 can be configured as the master switch, while the concealed switch controller(s) are configured as slave switches, whereby the concealed switches 920 are operated via commands received from the exposed switch controller.

Figure 11A:
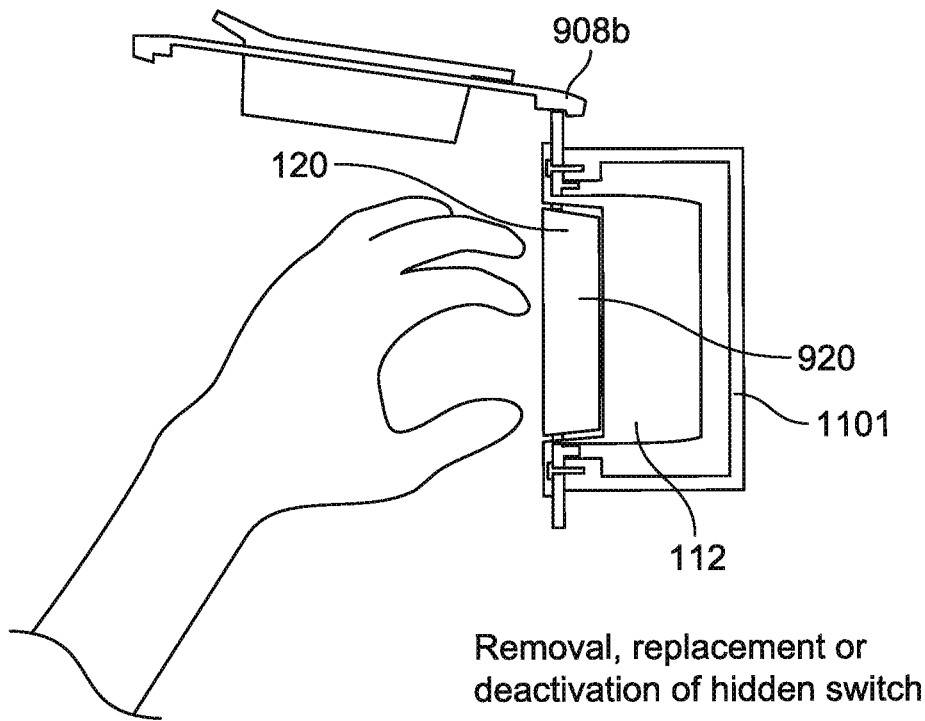
FIGS. 11A and 11B show operation of the wall-plate system and removal of the hidden switch controller.
Figure 11B:
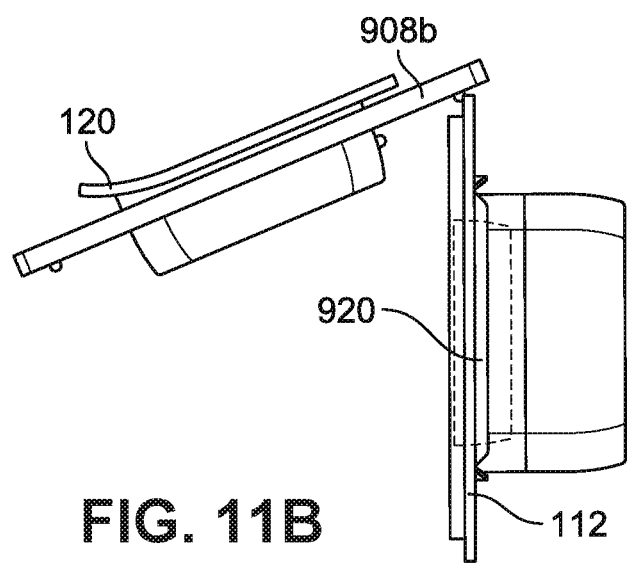

FIGS. 11A and 11B show operation of the wall-plate system and removal of the hidden switch controller. As demonstrated in FIG. 11A, the base module 112 is mounted in an electrical wall box 1101. The concealed switch controller 920 is coupled to a base module 112 in the wall box and the exposed switch controller 120 is coupled to a separate base module 112 in the wall box (e.g. before being unnested by lifting of the wall-plate cover). Removal of the wall-plate cover 908b to disengage and unnest the exposed switch controller 120 can be configured to cause deactivation of the one or more hidden switch controllers 920. Once the cover 908b is removed, the concealed switch controllers 920 are accessible.

One or more magnets in the wall-plate 908b promote quick and easy access to components underneath. Additionally, the wall-plate 908b can serve as a safety measure for accessing an airgap switch in each hidden switch controller 920 (the hidden switch controller 920 still controls line voltage in the same way each traditionally designed Master and Slave switch controller do, therefore the hidden switch controller 920 still should maintain the same safety measures like an airgap system (as described in further detail in U.S. application No. 62/359,670 filed concurrently herewith and incorporated by reference herein, hereby, in its entirety) for opening an electric circuit when needed for example for changing a bulb for example). The wall-plate 908*b* is hinged to a chassis that rotates open to access the hidden switch controllers 920 for servicing and activating the air gap. The upwardly rotated wallplate 908*b* pulls the traditional/unhidden switch out with it and conveniently holds it in place while the hidden switches are being accessed.

FIGS. 11A and 11B show operation of the wall-plate system and removal of the hidden switch controller. As demonstrated in FIG. 11A, the base module 112 is mounted in an electrical wall box 1101. The concealed switch controller 920 is coupled to a base module 112 in the wall box and the exposed switch controller 120 is coupled to a separate base module 112 in the wall box (e.g. before being unnested by lifting of the wall-plate cover. Removal of the wall-plate cover 908*c* to disengage and unnest the exposed switch controller 120 can be configured to cause deactivation of the one or more hidden switch controllers 920. Once the cover 908*b* is moved, the concealed switch controllers 920 are accessible.

One or more magnets in the wall-plate 908*b* promote quick and easy access to components underneath. Additionally, the wall-plate 908*b* can serve as a safety measure for accessing an airgap switch in each hidden switch controller 920 (the hidden switch controller 920 still controls line voltage in the same way each traditionally designed Master and Slave switch controller do, therefore the hidden switch controller 920 still should maintain the same safety measures like an airgap system (as described in further detail in U.S. application No. 62/359,670 filed concurrently herewith and incorporated by reference herein, hereby, in its entirety) for opening an electric circuit when needed for example for changing a bulb for example). The wall-plate 908*c* is hinged to a chassis that rotates open to access the hidden switch controllers 920 for servicing and activating the air gap. The upwardly rotated wall-plate 908*b* pulls the traditional/unhidden switch out with it and conveniently holds it in place while the hidden switches are being accessed.

Figure 12A:
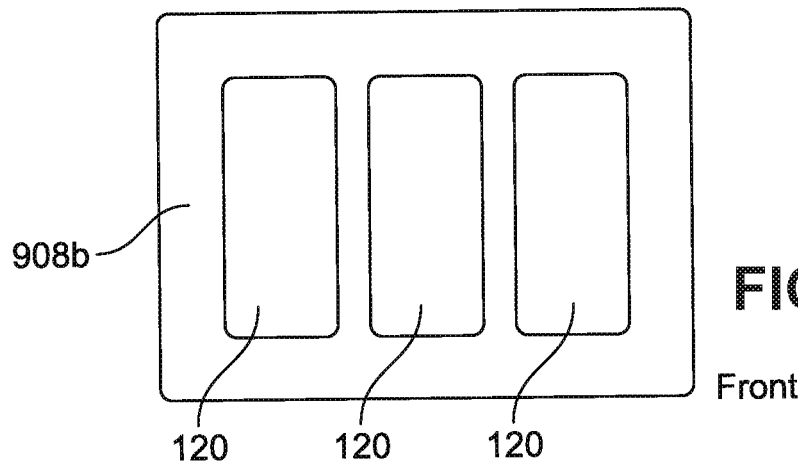
FIGS. 12A-12C show a switch including all exposed switch controllers.
Figure 12B:
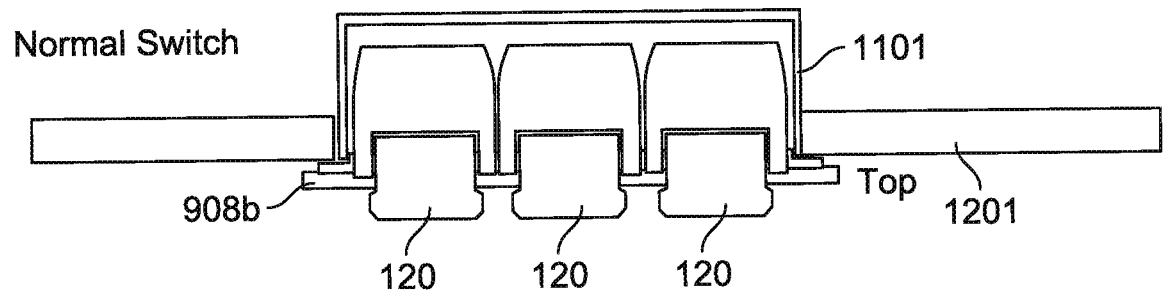
Figure 12C:
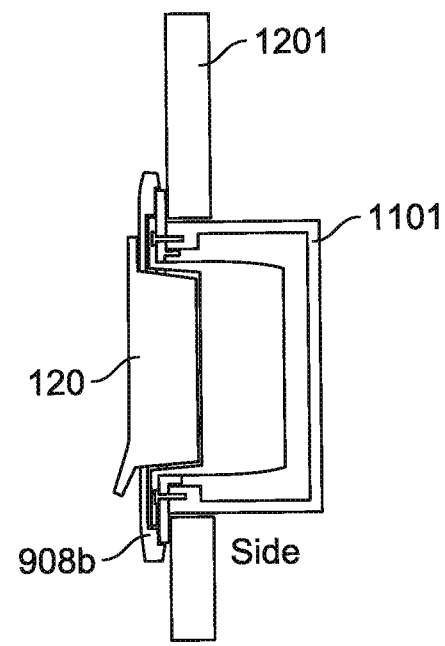

FIGS. 12A-12C show a switch including all exposed switch controllers. FIG. 12A shows a front view. FIG. 12B shows a top view of the switches mounted in a switch box 1101 in wall 1201. FIG. 12C shows a side view. As depicted in FIGS. 12A and 12B, all of the exposed switches 120 extend through the wall plate cover 908*b*.

Figure 13A:
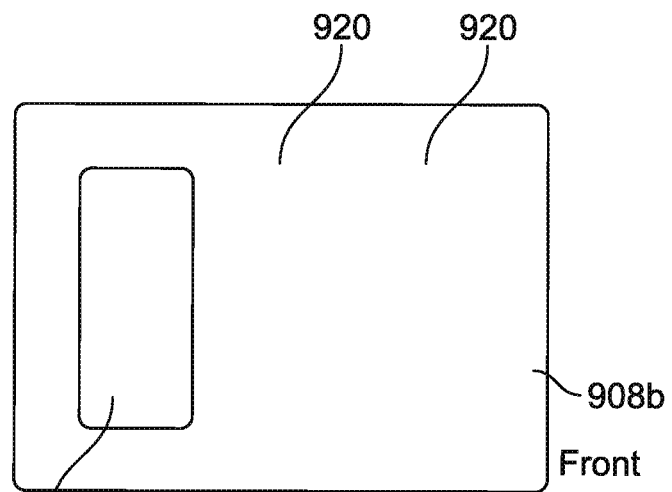
FIGS. 13A-13C show a switch including an exposed switch controller and concealed switch controllers.
Figure 13B:
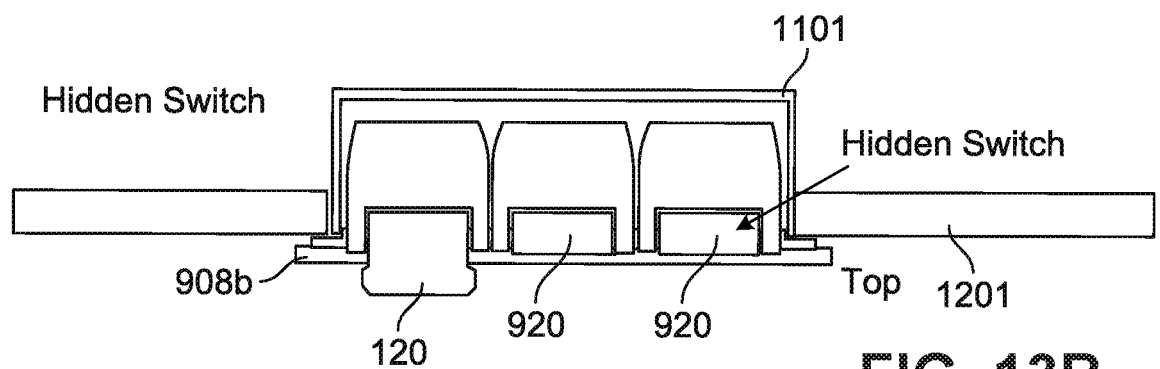
Figure 13C:
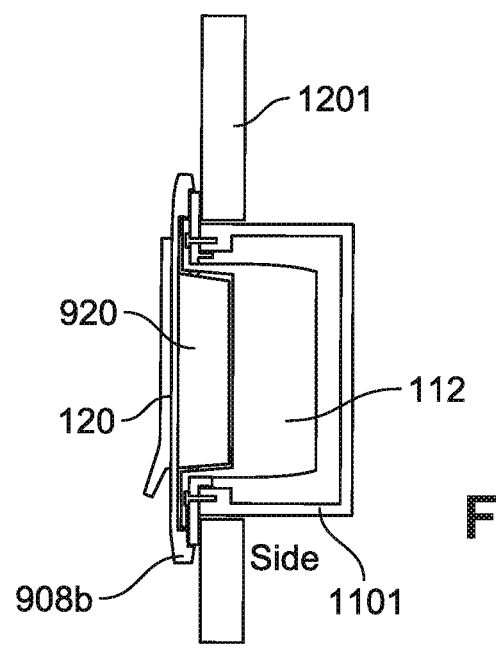

FIGS. 13A-13C show a switch including an exposed switch and concealed switches. FIG. 13A shows a front view. FIG. 13B shows a top view of the switches mounted in a switch box 1101 in wall 1201. FIG. 13C shows a side view. As shown in FIGS. 13A and 13B, only the exposed switch controller 120 is visible from a front side of the wall plate 908*b* while the recessed switch controllers 920 are nested behind the wall plate 908*b*.

Implementations of the subject matter and the operations described in this specification can be implemented by digital electronic circuitry, or via computer software, firmware, or hardware, including the structures disclosed in this specification and their structural equivalents, or in combinations of one or more of them. Implementations of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Implementations of the subject matter described in this specification can be implemented in a computing system that includes a back end component, e.g., as a data server, or that includes a middleware component, e.g., an application server, or that includes a front end component, e.g., a user computer having a graphical display or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some implementations, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

For the purpose of this disclosure, the term "coupled" means the joining of two members directly or indirectly to one another. Such joining may be stationary or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It should be noted that the orientation of various elements may differ according to other exemplary implementations, and that such variations are intended to be encompassed by the present disclosure. It is recognized that features of the disclosed implementations can be incorporated into other disclosed implementations.

While various inventive implementations have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive implementations described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive implementations described herein. It is, therefore, to be understood that the foregoing implementations are presented by way of example only and that, within the scope of the appended claims and equivalents thereto, inventive implementations may be practiced otherwise than as specifically described and claimed. Inventive implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, implementations may be constructed in which acts are performed in an order different than illustrated, which may include performing some acts simultaneously, even though shown as sequential acts in illustrative implementations.

The claims should not be read as limited to the described order or elements unless stated to that effect. It should be understood that various changes in form and detail may be made by one of ordinary skill in the art without departing from the spirit and scope of the appended claims. All implementations that come within the spirit and scope of the following claims and equivalents thereto are claimed.

What is claimed is:

1. An apparatus comprising:
   a first base module having a base housing forming a first well and including a first connector positioned in the first well, the first base module including a power terminal configured to receive electrical current from an alternating current (AC) power supply, the first base module further having a first dimmer circuit configured to modulate a flow of the received electrical current to a load terminal coupled to a first lighting circuit;
   a wall plate cover releasably attached to the first base module; and
   a switch controller mounted in the wall plate cover, the switch controller including a second connector configured to engage with electrical coupling to the first connector when the wall plate cover is pivoted to the first base module, wherein the switch controller is configured to send one or more commands to the first base module to control the first dimmer circuit via the electrical coupling of the first connector to the second connector in response to touching of a tactile interface coupled to the switch controller.

2. The apparatus of claim 1 further comprising one or more magnets, wherein a force of the magnets holds the wall-plate cover to the first base module when the wall plate cover is pivoted to the first base module.

3. The apparatus of claim 1 further comprising an airgap switch connected to the load terminal to interrupt the flow of the received electrical current to the load terminal, the airgap switch hidden when the wall-plate cover is pivoted to the first base module.

4. The apparatus of claim 1 wherein the switch controller further comprises a display coupled to the tactile interface.

5. The apparatus of claim 1 wherein the first base module further comprises a wireless communication module for receiving the one or more commands from a second base module.

6. The apparatus of claim 1 further comprising:
   a multi-gang wall box holding the first base module and a second base module adjacent to the first base module, the second base module including a second well configured to receive the electrical current from the AC power supply, the first base module further having a second dimmer circuit configured to control the flow of the received electrical current to a second lighting circuit; and
   a concealed controller mounted in the second well by one or more spring biased latches, wherein the wall plate cover conceals the second well when the wall plate cover is pivoted to the first base module, and wherein the concealed controller includes a wireless communication module configured to receive the one or more commands from the switch controller, the one or more commands for setting a lighting scene associated with the first and second lighting circuits.

7. The apparatus of claim 6 wherein the concealed controller further comprises an airgap switch configured to interrupt the flow of the received electrical current to the second lighting circuit when the concealed controller is removed from the second well.

8. The apparatus of claim 6 wherein the concealed controller includes a light visible through a cover for seeing an operational status.

9. The apparatus of claim 6 wherein the concealed controller is configured as a slave to the switch controller configured as a master.

10. The apparatus of claim 6 wherein the switch controller is configured to cause the concealed controller to deactivate when the wall plate cover is pivoted away from the first base module.

11. The apparatus of claim 6 wherein the concealed controller excludes a display.

12. The apparatus of claim 6 wherein the concealed controller further comprises a processor for controlling the second dimmer circuit in response to the received one or more commands.

13. An apparatus comprising:
   a base module having a base housing forming a well and including a first connector positioned in the well, the base module including a power terminal configured to receive electrical current from an alternating current (AC) power supply, the base module further having a first dimmer circuit configured to modulate a flow of the received electrical current to a load terminal coupled to a first lighting circuit;
   a wall plate cover releasably attached to the base module; and
   a concealed controller mounted in the well by one or more spring biased latches, wherein the wall-plate cover conceals the well when the wall plate cover is pivoted to the base module, and wherein the concealed controller includes a wireless communication module configured to receive one or more commands from a switch controller mounted in a gang location of a multi-gang electrical wall box different than the concealed controller, the one or more commands for setting a lighting scene associated with the first lighting circuit.

14. The apparatus of claim 13, wherein the switch controller is electrically coupled to a second lighting circuit associated with the lighting scene.

15. The apparatus of claim 13, wherein the concealed controller is mounted in a first electrical wall box and the switch controller is mounted in a second electrical wall box separate from the first electrical wall box.

16. The apparatus of claim 13 wherein the concealed controller further comprises an airgap switch configured to interrupt the flow the received electrical current to the first lighting circuit.

17. An apparatus comprising:
   a base module having a base housing forming a well and including a first connector positioned in the well, the base module including a power terminal configured to receive electrical current from an alternating current (AC) power supply, the base module further having a circuit for controlling the flow of the received electrical current to a lighting circuit;
   a wall-plate cover pivotally attached to the base module using a spring;
   a tactile display included in a switch controller mounted in the wall plate cover, the switch controller including a second connector configured to engage with electrical coupling to the first connector when the wall-plate cover is pivoted to the base module, wherein the switch controller is configured to execute program instructions to send one or more commands via the electrical coupling of the first connector to the second connector in response to input on the tactile display to produce a lighting scene using the lighting circuit.

18. The apparatus of claim 17, further comprising one or more magnets, wherein a force of the magnets holds the wall plate cover to the base module when the wall plate cover is pivoted to the base module.

19. The apparatus of claim 17 wherein the one or more commands adjust a plurality of light fixtures to produce the lighting scene.

* * * * *